United States Patent
Miyajima

(10) Patent No.: US 7,329,601 B2
(45) Date of Patent: Feb. 12, 2008

(54) METHOD OF MANUFACTURING SEMICONDUCTOR DEVICE

(75) Inventor: Hideshi Miyajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 347 days.

(21) Appl. No.: 11/072,294

(22) Filed: Mar. 7, 2005

(65) Prior Publication Data

US 2005/0233583 A1 Oct. 20, 2005

(30) Foreign Application Priority Data

Mar. 31, 2004 (JP) ............................. 2004-107340

(51) Int. Cl.
*H01L 21/4763* (2006.01)

(52) U.S. Cl. ...................... 438/637; 438/638; 438/639; 438/640

(58) Field of Classification Search ......... 438/637–640
See application file for complete search history.

(56) References Cited

U.S. PATENT DOCUMENTS

| 6,413,879 | B1 | 7/2002 | Maeda | |
|---|---|---|---|---|
| 6,790,770 | B2* | 9/2004 | Chen et al. | 438/637 |
| 7,164,206 | B2* | 1/2007 | Kloster et al. | 257/767 |
| 2001/0008226 | A1* | 7/2001 | Hung et al. | 216/18 |

FOREIGN PATENT DOCUMENTS

| JP | 2001-345380 A | 12/2001 |
|---|---|---|
| JP | 2002-353308 | 12/2002 |
| JP | 2003-347403 A | 12/2003 |
| WO | WO 03/081665 A1 | 10/2003 |

OTHER PUBLICATIONS

Michael, N. L. et al., "Study of Side Seal/Bond Pad Integrity in Ultra Low-k Dielectric/Cu Integration", Advanced Metallization Conference 2003 (AMC 2003), Conference Proceedings AMC XIX, Material Research Society, pp. 185-188, (2003).
Clark, P. G. et al., "Cleaning and Restoring k Value of Porous MSQ Films", Semicon. Int. (USA), vol. 26, No. 9, pp. 46-52, (Aug. 2003).
Notification of the First Office Action from the Patent Office of the People's Republic of China, dated Jun. 23, 2006.
Notification of Reasons for Rejection from the Japanese Patent Office, mailed Oct. 17, 2006.

* cited by examiner

*Primary Examiner*—Hsien-Ming Lee
(74) *Attorney, Agent, or Firm*—Finnegan, Henderson, Farabow, Garrett & Dunner, L.L.P.

(57) ABSTRACT

Disclosed is a method for manufacturing a semiconductor device, comprising forming a low dielectric constant insulating film having a porous structure above a semiconductor substrate, forming a recess in the low dielectric constant insulating film, providing a burying insulating film above the low dielectric constant insulating film having the recess and in the recess, removing a the burying insulating film provided in the recess, thereby opening the recess, and burying conductive material in the recess, forming a conductive portion.

19 Claims, 3 Drawing Sheets

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2004-107340, filed Mar. 31, 2004, the entire contents of which are incorporated herein by reference.

BACKGROUND OF THE INVENTION

1. Field of the Invention

The present invention relates to a method of manufacturing a semiconductor device, particularly, to a method of manufacturing a semiconductor device having a multi-layered wiring structure.

2. Description of the Related Art

In recent years, a buried Cu wiring in which a film having a low dielectric constant is used for forming an interlayer insulating film is widely used for improving the operating speed of semiconductor devices. A porous insulating film having fine pores is advantageous in that it makes it possible to secure a low relative dielectric constant of about 2.0. However, it is difficult for the porous insulating film noted above to obtain a sufficiently high wiring reliability.

To be more specific, an interlayer insulating film formed of a porous insulating film is likely to receive damage in forming a recess in the interlayer insulating film or in processing or removing a film deposited on the interlayer insulating film. As a result, generated are various problems such as an increase in the relative dielectric constant, a poor breakdown voltage between the adjacent wirings, peeling, cracking, and diffusion of the metal atoms. In order to avoid these problems, it is proposed to repair the damaged layer generated in the porous insulating film by treating with hexamethyl disilazane (HMDS) or dissolving the damaged layer by the treatment with, for example, a hydrogen fluoride for removing the damaged layer.

If the damaged layer is removed, the size of the recess such as a via or a wiring trench is increased, making it difficult to form the via or the wiring trench at a desired size. Also, where the damaged layer is repaired by the treatment with HMDS, it is certainly possible to restore the concentration of the carbon element in the damaged layer. However, it is impossible to obtain a sufficient increase in density. As a result, the metal is diffused into the porous film in a step of forming a metal wiring layer so as to give rise to the problem that the reliability of the wiring layer tends to be degraded. Thus, a new problem is generated as pointed out above even if the damaged layer is repaired or removed. A method of avoiding the influences given by the damaged layer generated in a porous insulating film without giving rise to any inconvenience has not yet been developed.

According to the technology node of "International Technology Roadmap of Semiconductor (ITRS)", the minimum distance between the adjacent wirings after the 90 nm era will be less than about 0.1 μm and, thus, the metal diffused into the interlayer insulating film will cause a micro current leakage. As a result, the reliability of the metal wiring will be lowered. Since the distance between the adjacent wirings will be made further shorter in the era after the technology node of 65 nm, the problem derived from the diffusion of metal atoms will be made further prominent.

BRIEF SUMMARY OF THE INVENTION

A method for manufacturing a semiconductor device according to one aspect of the present invention comprises forming a low dielectric constant insulating film having a porous structure above a semiconductor substrate; forming a recess in the low dielectric constant insulating film; providing a burying insulating film above the low dielectric constant insulating film having the recess and in the recess; removing the burying insulating film provided in the recess, thereby opening the recess; and burying conductive material in the recess, forming a conductive portion.

DETAILED DESCRIPTION OF THE INVENTION

Some embodiments of the present invention will be described with reference to the accompanying drawings.

Embodiment 1

FIGS. 1 to 7 are cross sectional views collectively showing a manufacturing method of a semiconductor device according to embodiment 1 (first embodiment) of the present invention.

Figure 1:
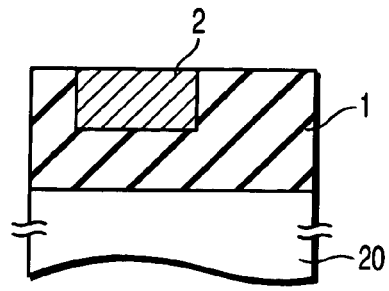
FIG. 1 is a cross sectional view showing a step of the manufacturing method of a semiconductor device according to one embodiment of the present invention.
Figure 2:
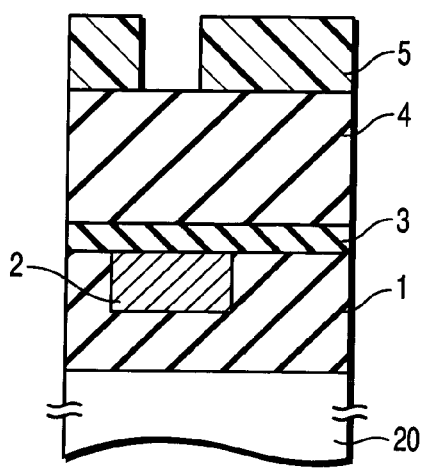
FIG. 2 is a cross sectional view showing a step following the step shown in FIG. 1.

In the first step, an insulating film 1 was formed on a semiconductor substrate 20 having a semiconductor element (not shown) formed therein, followed by burying a lower layer Cu wiring 2 within the insulating film 1 with a barrier metal layer (not shown) interposed therebetween by an ordinary method, as shown in FIG. 1. Further, an etching stopper film 3 having a thickness of 50 nm and a porous low dielectric constant insulating film 4 having a thickness of 350 nm were successively deposited over the entire surface, followed by forming a resist pattern 5 on the porous insulating film 4 by a photolithography method, as shown in FIG. 2. Incidentally, the term "a low dielectric constant" means a relative dielectric constant of 3.0 or less in this specification.

A SiCN:H film formed by a plasma CVD method using an organic silane (alkyl silane) and $NH_3$ was used as the etching stopper film 3. It is also possible to form an insulating film capable of suppressing the Cu diffusion such as a SiC:H film, a SiCO:H film, a SiN film or a SiN:H film as the etching stopper film 3.

A porous MSQ (methyl silsesquioxane) film formed by the coating method was used as the porous insulating film 4 having a low dielectric constant. The porous MSQ film has a low relative dielectric constant, i.e., about 2.2. The low relative dielectric constant is derived from the fine pores present within the porous MSQ film. The insulating film having a low relative dielectric constant of this level also includes, for example, a fluorocarbon film, a polyarylene film or a SiCO:H film in addition to the MSQ film. These insulating films may also be formed by the CVD method.

It is also possible to form an interlayer insulating film of a laminate structure comprising a porous insulating film having a low dielectric constant and another insulating film. In this case, a laminate structure of insulating films comprising, for example, a combination of a polyarylene film and an MSQ film, a combination of a fluorocarbon film and a SiCO:H film or a combination of a $SiO_2$ film and an MSQ film can be formed by an optional method.

Figure 3:
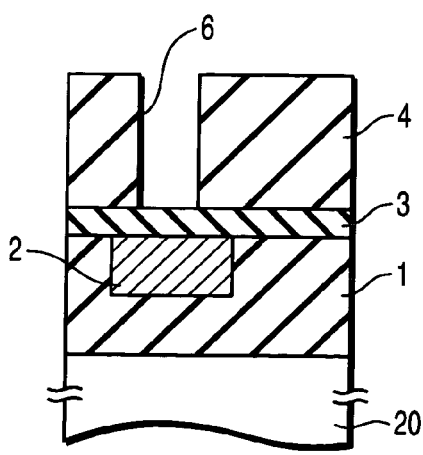
FIG. 3 is a cross sectional view showing a step following the step shown in FIG. 2.

In the next step, the porous insulating film 4 having a low dielectric constant was processed (selectively removed) by an RIE (reactive ion etching) method using a fluorocarbon series gas with the resist pattern 5 used as a mask so as to form a recess, i.e., a via hole 6, followed by removing the resist pattern 5 by using a discharged $O_2$ gas to obtain the structure shown in FIG. 3. In this case, the methyl group ($—CH_3$) was oxidized by the discharged $O_2$ gas to generate a hydroxyl group (—OH), with the result that a damaged layer (not shown) was formed on the side surface of the via hole 6 and on the upper surface of the porous insulating film 4. Incidentally, in the case of using, for example, $NH_3$, which does not oxidize the porous insulating film having a low dielectric constant, in place of $O_2$ in the step of removing the resist pattern 5, a damaged layer is generated on at least the side surface of the via hole 6 by the fluorocarbon series gas used in the processing step of the recess.

Figure 4:
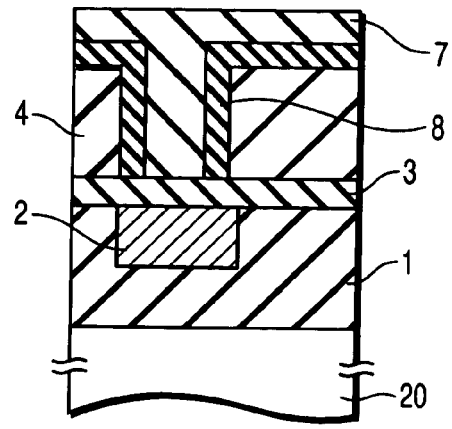
FIG. 4 is a cross sectional view showing a step following the step shown in FIG. 3.

In the next step, a burying insulating film 7 was formed on the porous insulating film 4 having the via hole 6, as shown in FIG. 4. Incidentally, the burying insulating film noted above denotes an insulating film that is temporarily buried in the recess and is removed in the subsequent step. For forming the burying insulating film 7, it is possible to use a varnish prepared by, for example, dissolving methyl siloxane in a solvent. It is possible to use as the solvent a mixture including propylene glycol monopropyl ether (PGPE) and propylene glycol monoethyl ether (PGEE). The burying insulating film 7 as shown in FIG. 4 can be formed by forming a coated film by a spin coating method, followed by heating the coated film. It is desirable to carry out the heating treatment stepwise. If the heating is rapidly carried out at a high temperature, the solvent within the coated film is rapidly evaporated to roughen the film surface. For example, the heating can be carried out at 50 to 150° C. for 0.5 to 5.0 minutes and, then, at 150 to 300° C. for 0.5 to 5.0 minutes, followed by performing a baking treatment at 350 to 450° C. for 30 to 120 minutes. By this method, the solvent within the coated film is gradually evaporated to suppress the surface roughening of the film. In the embodiment of the present invention, the heating was carried out at 150° C. for one minute and, then, at 200° C. for one minute, followed by performing a baking treatment at 350° C. for 30 minutes to form the burying insulating film 7 as shown in FIG. 4. The flatness of the surface of the burying insulating film 7 is not critical at this stage. Also, no particular problem is generated even if a void is generated in the film in the process of forming the burying insulating film 7.

It is desirable for the methyl siloxane used for forming the burying insulating film 7 to have a molecular weight of about 500 to about 10,000. Where the molecular weight is less than 500, methyl siloxane is diffused deeper than required into the film, with the result that the relative dielectric constant of the entire film tends to be increased. On the other hand, if the molecular weight of methyl siloxane exceeds 10,000, it is possible for methyl siloxane to fail to be diffused into the film sufficiently, resulting in failure to obtain a sufficient effect. Also, it is possible to use, for example, propylene glycol monomethyl ether acetate (PGMEA), cyclohexanone (CHN), γ-butyrolactone (GBL), ethyl lactate (EL), ethyl 3-ethoxy propionate (EEP), diethyl ketone (DEK), or isopropyl alcohol (IPA) as the solvent. Further, it is possible to use an organic monomer forming a fluorocarbon film or a polyarylene film by the baking or a monomer material having an organic aromatic structure. To be more specific, a PTFE (polytetrafluoroethylene) film, a PCS (poly-Carbo-Silane) film, a PAR (polyarylene) film, and a PAE (polyarylene ether) film, etc. correspond to the materials utilizing the monomers referred to above. It is desirable for the organic monomer noted above to have a molecular weight of about 500 to about 10,000 in this case, too, due to the reasons given above. It is possible to prepare a varnish by dissolving the particular organic monomer compound in the solvent referred to above and to form the burying insulating film 7 by using the varnish.

Components of these materials are left within the porous insulating film 4. Thus, in order to avoid generating a detrimental effect on the performance of the semiconductor device, a material is required to have a sufficiently high resistance to heat and a low relative dielectric constant. For these reasons, it is desirable to use an organic film or a SiCOH film as the burying insulating film 7.

By forming the burying insulating film 7 on the porous insulating film 4 having a low dielectric constant, the damaged layer generated on the side surface of the via hole 6 is reinforced to convert the damaged layer into a densified layer 8. Since the burying insulating film 7 is formed by coating a methyl siloxane-based varnish in this embodiment, the varnish is diffused sufficiently through the side surface of the via hole 6 into the porous insulating film 4, and the porous insulating film 4 is impregnated with the varnish. The solvent contained in the varnish is removed by the succeeding heat treatment. In this stage, the water present in the damaged layer is removed simultaneously. Further, methyl siloxane diffused into the porous insulating film 4 is integrated with the matrix of the porous insulating film 4 within the pores. As a result, the side surface of the via hole 6 formed in the porous insulating film 4 is reinforced and densified to form the densified layer 8. The damaged layer is also generated on the upper surface of the porous insulating film 4. The damaged layer generated in this portion is also reinforced and densified by the similar mechanism to form the densified layer 8 on the upper surface of the porous insulating film 4.

It is not necessary for the densified layer 8 to be formed on the entire region of the damaged layer. It suffices for the densified layer 8 to be exposed to the side surface in the subsequent step of forming a via hole 6' to prevent the metal atoms from being diffused into the porous insulating film 4.

Figure 5:
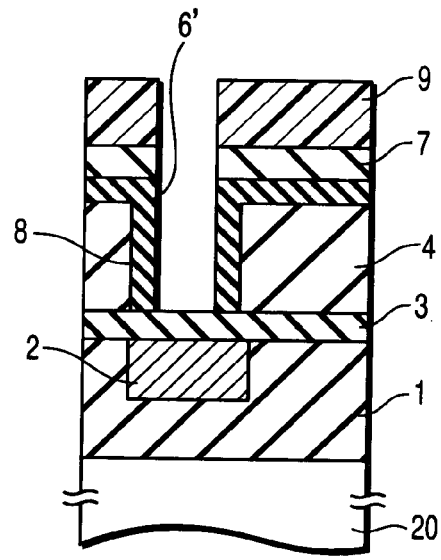
FIG. 5 is a cross sectional view showing a step following the step shown in FIG. 4.

Further, a resist pattern 9 was formed on the burying insulating film 7, followed by processing (selectively removing) the burying insulating film 7 by applying again the RIE treatment with the resist pattern 9 used as a mask to form the via hole 6' as shown in FIG. 5. Where the via hole 6' is formed in a region other than the region surrounded by the densified layer 8, a damaged layer is newly formed in the porous insulating film 4 having a low dielectric constant. In order to avoid this, it is most desirable to form the via hole 6' at a position in which the via hole 6 was formed previously. However, no particular problem is generated even if the position of the via hole 6' deviates from the position in which the via hole 6 was formed previously by about 20 nm.

Figure 6:
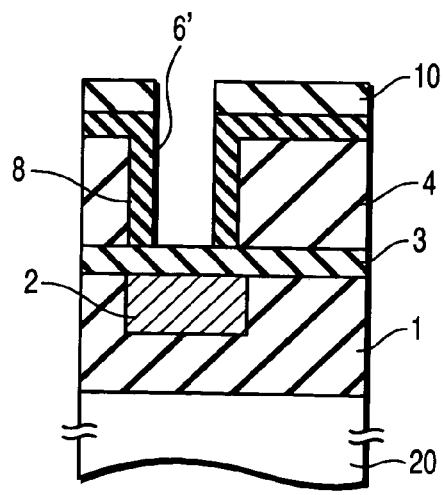
FIG. 6 is a cross sectional view showing a step following the step shown in FIG. 5.

If the resist pattern 9 is removed by using a discharged $O_2$ gas, the burying insulating film 7 remaining on the porous insulating film 4 having a low dielectric constant is densified to be converted into a cap layer 10 formed of a SiOCH film as shown in FIG. 6. The cap layer 10 can be further densified by the baking treatment at 350° C. for 30 minutes.

Figure 7:
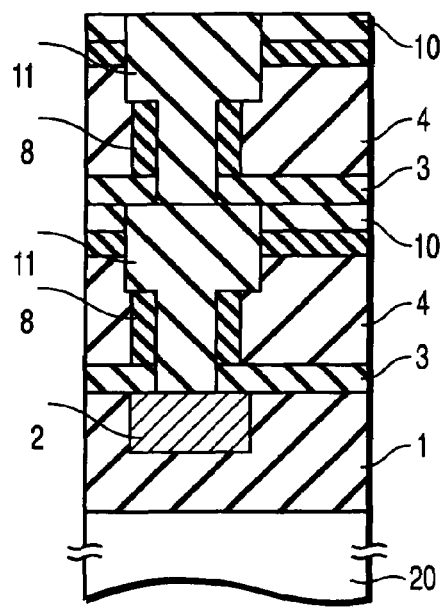
FIG. 7 is a cross sectional view showing the semiconductor device manufactured by the method according to one embodiment of the present invention.

In the subsequent steps, a wiring trench was formed by an ordinary method, followed by selectively removing the portion of the etching stopper film 3 that remains at the bottom of the via hole 6'. Then, a Cu wiring 11 was buried as a conductive portion within the recess with a metal barrier (not shown) interposed therebetween. Further, the process steps ranging from the formation of the etching stopper film 3 to the formation of the buried Cu wiring 11 were repeated a prescribed number of times to obtain a multi-layered wiring structure as shown in FIG. 7.

The reliability was evaluated in respect of the semiconductor device thus manufactured. To be more specific, the generation frequency of wiring breakages was measured by heating the semiconductor device under a nitrogen gas atmosphere of 225° C. having a normal pressure. In this measurement, the degree of elevation of the wiring resistance was used as a criterion for wiring breakage. As a result, the ratio of the defective wiring was found to be only 0.2% even 1,000 hours later in the semiconductor device manufactured by the method according to the embodiment of the present invention. For comparison, the reliability was similarly evaluated in respect of the semiconductor device manufactured by the conventional method. In this case, the ratio of the defective wiring was found to have increased to 69%, supporting that the manufacturing method according to the embodiment of the present invention permits improving the reliability of the wiring.

In the embodiment of the present invention, the damaged layer generated in the surface of the via hole formed in the porous insulating film was densified by using a burying insulating film formed of a prescribed material, with the result that it was possible to sufficiently prevent the diffusion of the metal atoms. In addition, the method according to the embodiment of the present invention makes it possible to form a via hole of the designed size and to form a via in a desired position. Also, a densifying effect that was not obtained sufficiently in the conventional repairing treatment can be obtained by the embodiment of the present invention. As a result, it is possible to avoid the inconvenience that the reliability of the wiring is lowered by the diffusion of the metal into the porous material layer in the step of forming a barrier metal layer.

Embodiment 2

FIGS. 8 to 14 are cross sectional views collectively showing a manufacturing method of a semiconductor device according to embodiment 2 (second embodiment) of the present invention.

Figure 8:
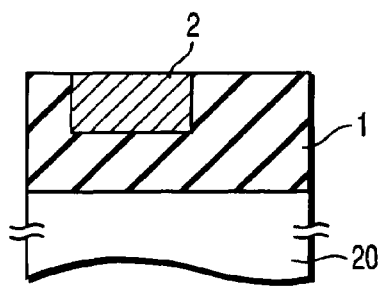
FIG. 8 is a cross sectional view showing a step of the manufacturing method of a semiconductor device according to another embodiment of the present invention.
Figure 9:
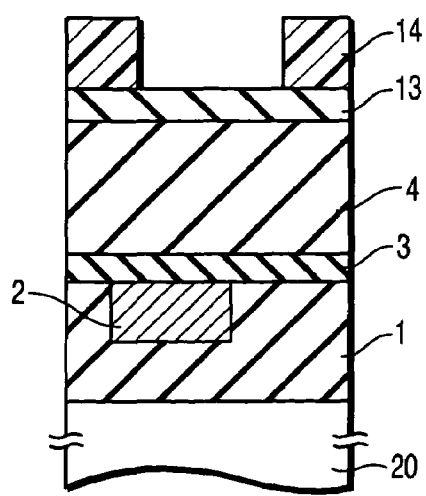
FIG. 9 is a cross sectional view showing a step following the step shown in FIG. 8.

In the first step, an insulating film 1 was formed on a semiconductor substrate 20 having a semiconductor element (not shown) formed therein, followed by burying a lower layer Cu wiring 2 in the insulating film 1 with a barrier metal layer (not shown) interposed therebetween by an ordinary method, as shown in FIG. 8. Then, an etching stopper film 3 having a thickness of 50 nm, a porous low dielectric constant insulating film 4 having a thickness of 350 nm, and a cap insulating film 13 were deposited successively, followed by forming a resist pattern 14 on the cap insulating film 13 by the photolithography method, as shown in FIG. 9.

The etching stopper film 3 and the porous insulating film 4 having a low dielectric constant were formed as in the first embodiment described above. On the other hand, a $SiO_2$ film formed by a plasma CVD method using a $SiH_4$ gas and a $N_2O$ gas was used as the cap insulating film 13.

Figure 10:
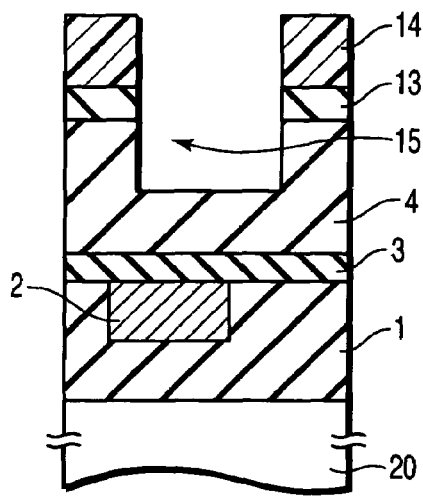
FIG. 10 is a cross sectional view showing a step following the step shown in FIG. 9.

In the next step, the cap layer 13 and the porous insulating film 4 having a low dielectric constant were successively processed (selectively removed) by a RIE method using a fluorocarbon series gas ($CHF_3$/$CF_4$ mixed gas) to form a wiring trench 15 as a recess as shown in FIG. 10. During the RIE treatment, H and F were liberated from the fluorocarbon series gas, O was generated from MSQ forming the porous insulating film 4 having a low dielectric constant. The C-containing component within the film, particularly the methyl group ($-CH_3$), were oxidized by the radicals of H, F and O to form a hydroxyl group ($-OH$). As a result, a damaged layer was formed on the bottom surface and the side surface of the wiring trench 15.

Figure 11:
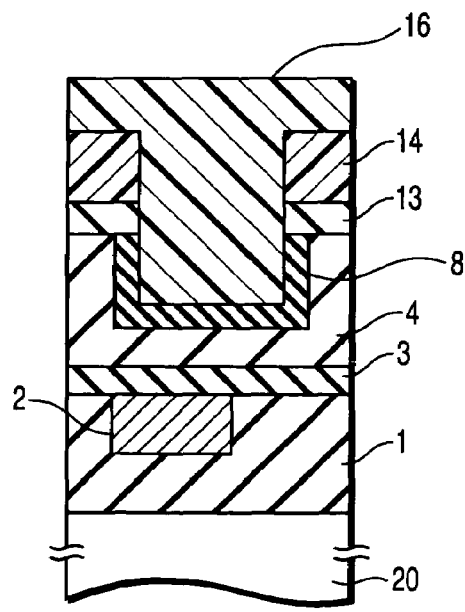
FIG. 11 is a cross sectional view showing a step following the step shown in FIG. 10.

Then, a burying insulating film 16 was formed on the porous low dielectric constant insulating film 4 having the wiring trench 15 under the state that the cap layer 13 and the resist pattern 14 were left unremoved, as shown in FIG. 11. In this embodiment, the burying insulating layer 16 was deposited under a low temperature of 200° C. or less so as to make it unnecessary to remove the resist pattern 14. To be more specific, the burying insulating film 16 formed of $SiO_2$ was formed as shown in FIG. 11 by a CVD method using a $SiH_4$ gas and a $N_2O$ gas as raw materials.

Since the resist pattern 14 has a low resistance to heat, it is desirable to control the temperature in the film-forming stage to 200° C. or less. In this case, it is desirable to carry out a heating under a temperatures of 350° C. or more as a pretreatment before formation of a metal wiring to sufficiently remove the OH group and water from within the film, thereby obtaining a high wiring reliability.

Incidentally, where a heat resistant material such as polyarylene or polyimide is utilized for forming the resist mask, it is possible to deposit an $SiO_2$ film under a high temperature not lower than 200° C. to form the burying insulating film 16. However, since such a heat resistant material does not in general have photosensitivity, it is necessary to transfer in advance a pattern by using a so-called "hard mask".

It is possible to form the burying insulating film 16 by a CVD method by using various kinds of gaseous materials as the raw materials. For example, it is possible to form an $SiO_2$ film, SiOCH film, SiCH film, SiCNH film or SiN film as the burying insulating film 16 by a CVD method using an organic silane gas as the raw material. It is also possible to form a CH film, a CHO film, a CHN film, a CHNO film, a CHF film or a CF film as the burying insulating film 16 by a CVD method using a gas containing at least C as the raw material.

As shown in FIG. 11, the porous insulating film 4 having a low dielectric constant is exposed to the side surface and the bottom surface of the wiring trench 15. A densified layer 8 is formed in the exposed region of the porous insulating film 4 by forming the burying insulating layer 16. Since the burying insulating film 16 is formed by a plasma CVD method using an $SiH_4$ gas and an $N_2O$ gas as the raw material gases, these raw material gases are diffused sufficiently through the exposed surface of the wiring trench 15 into the porous insulating film 4, and the porous insulating film 4 is impregnated with the gases. Further, the $SiH_4$ gas and the $N_2O$ gas are excited by the discharge to selectively react with the Si—OH group present in the damaged layer, thereby densifying the damaged layer. As a result, even a gas of a compound having a low molecular weight is not diffused into the film and, thus, a detrimental effect is not generated. Where the CVD treatment is carried out under a high temperature of about 300° C. to about 400° C., the OH group and the water within the film are also removed simultaneously. Further, the silane diffused into the porous insulating film 4 is integrated with the matrix of the porous insulating film 4. As a result, surfaces of the wiring trench formed in the porous insulating film 4 are reinforced and densified to form a densified layer 8.

Figure 12:
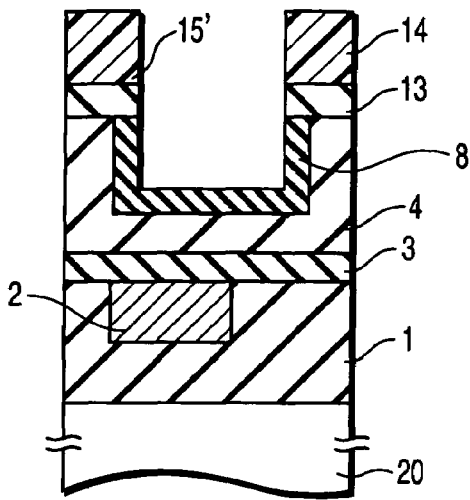
FIG. 12 is a cross sectional view showing a step following the step shown in FIG. 11.

In the next step, the burying insulating film 16 was selectively removed by a RIE treatment using a mixed gas of $CHF_3/CF_4$ to form a wiring trench 15' as shown in FIG. 12. As in the via hole 6' in embodiment 1, it is desirable for the wiring trench 15' to be formed in the same position as the wiring trench 15 formed previously. In the step of selectively removing the burying insulating film 16 in the second embodiment, the resist pattern 14 positioned below the burying insulating film 16 functions again as a mask. Therefore, the wiring trench 15' can be opened by self-alignment without giving rise to a positional deviation in the planar direction. In order to permit the densified layer to be exposed not only to the side surface but also to the bottom surface of wiring trench 15', it is desirable for the densified layer formed on the bottom surface of the wiring trench 15' to have a thickness not less than 20 nm. Where the processing accuracy of the wiring trench 15' is considered as a uniformity within a plane of the silicon substrate to be processed, a nonuniformity of about 20 nm is observed nowadays in the depth direction. It follows that, if the densified layer 8 present on the bottom surface has a thickness not smaller than 20 nm, the wiring trench 15' described above can be opened even if the processing nonuniformity is generated in the depth direction of the wiring trench.

Figure 13:
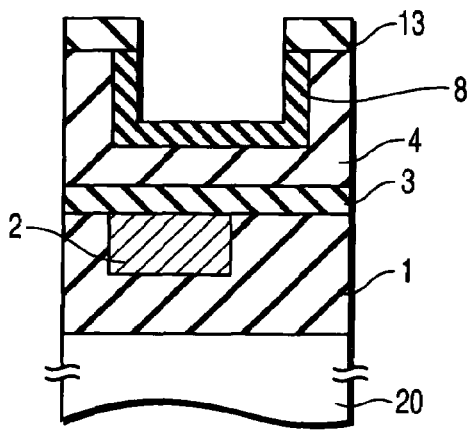
FIG. 13 is a cross sectional view showing a step following the step shown in FIG. 12.

In the next step, the resist pattern 14 was removed by using a discharged $O_2$ gas to expose the surface of the cap layer 13 to the outside, as shown in FIG. 13. Since the surface region defining the wiring trench 15' was already densified, surfaces of the wiring trench are not oxidized by the discharged $O_2$ to prevent a damaged layer from being formed again.

Figure 14:
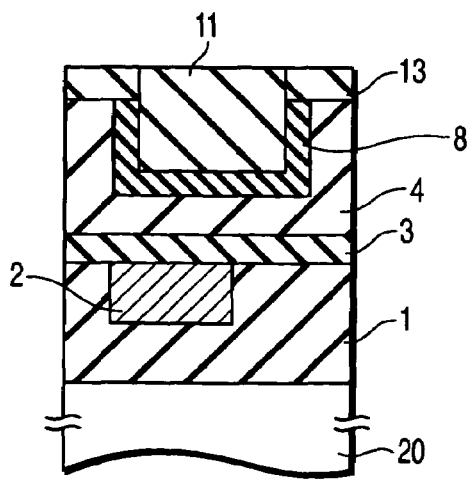
FIG. 14 is a cross sectional view showing the semiconductor device manufactured by the method according to another embodiment of the present invention.

In the subsequent steps, a barrier metal layer and an underlying copper layer were formed by an ordinary method, followed by burying a Cu wiring 11 in the wiring trench by a plating method to obtain a multi-layered wiring structure as shown in FIG. 14.

The reliability was evaluated in respect of the semiconductor device thus manufactured. To be more specific, the generation frequency of the wiring breakage was measured by heating the semiconductor device under a nitrogen gas atmosphere of 225° C. having a normal pressure. In this measurement, the degree of elevation of the wiring resistance was used as the criterion of the wiring breakage. As a result, the ratio of the defective wiring was found to be only 0.2% even 1,000 hours later in the semiconductor device manufactured by the method according to the second embodiment of the present invention. For comparison, the reliability was similarly evaluated in respect of the semiconductor device manufactured by the conventional method. In this case, the ratio of the defective wiring was found to have increased to 75%, supporting that the manufacturing method according to the second embodiment of the present invention permits improving the reliability of the wiring.

Needless to say, the technical scope of the present invention covers the formation of the wiring by the method described in conjunction with first embodiment and the formation of the via hole by the method described in conjunction with second embodiment.

Furthermore, it is possible to form a dual damascene wiring by combining appropriately the first and second embodiments of the present invention described above. In this case, the entire region of the insulating film in contact with the conductive layer such as the via and the wiring can be densified and, thus, the reliability of the semiconductor device is expected to be further improved.

According to one embodiment of the present invention, provided is a manufacturing method of a semiconductor device having a high wiring reliability and operable at a high speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:
    forming a low dielectric constant insulating film having a porous structure above a semiconductor substrate;
    forming a recess in the low dielectric constant insulating film;
    providing a burying insulating film above the low dielectric constant insulating film having the recess and in the recess, to densify a surface region of the recess, the surface region being constituted by the low dielectric constant insulating film;
    removing the burying insulating film provided in the recess, thereby opening the recess; and
    burying conductive material in the recess, forming a conductive portion.

2. The method according to claim 1, wherein the recess is opened by:
    forming a resist pattern above the burying insulating film; and
    selectively removing the burying insulating film by a RIE using the resist pattern as a mask.

3. The method according to claim 2, wherein the recess is opened without removing a portion of the burying insulating film provided on an upper surface of the low dielectric constant insulating film.

4. The method according to claim 3, further comprising removing the resist pattern after the recess is opened.

5. The method according to claim 4, wherein the resist pattern is removed by using a discharged $O_2$ gas and the portion of the burying insulating film that is left unremoved on the upper surface of the low dielectric constant insulating film is densified by the discharged $O_2$ to be converted into a cap layer.

6. The method according to claim 5, further comprising applying a heat treatment after removing the resist pattern, and wherein the cap layer is further densified by the heat treatment.

7. The method according to claim 1, wherein the recess is formed by:
    forming a resist pattern above the low dielectric constant insulating film; and
    selectively removing the low dielectric constant insulating film by a RIE using the resist pattern as a mask; and
    wherein the burying insulating film is provided above the low dielectric constant insulating film with the resist pattern interposed therebetween.

8. The method according to claim 7, wherein the recess is opened by selectively removing the burying insulating film by a RIE using the resist pattern as a mask, and forming the recess and opening the recess are performed by self-alignment.

9. The method according to claim 1, wherein the low dielectric constant insulating film comprises a methyl silsesquioxane film.

10. The method according to claim 1, further comprising forming a cap layer above the low dielectric constant insulating film, wherein the recess is formed in the low dielectric constant insulating film with piercing through the cap layer.

11. The method according to claim 1, wherein the recess is formed in the low dielectric constant insulating film by a RIE using a fluorocarbon series gas.

12. The method according to claim 1, wherein the burying insulating film comprises at least one of an organic film and a SiCOH film.

13. The method according to claim 1, wherein the recess is a wiring trench, and the surface region of the wiring trench is converted into a densified layer having a thickness of at least 20 nm.

14. The method according to claim 1, wherein the burying insulating film is provided by forming a coated film of a varnish, followed by heating the coated film.

15. The method according to claim 14, wherein the varnish is prepared by dissolving methyl siloxane in a solvent.

16. The method according to claim 15, wherein a molecular weight of methyl siloxane is 500 to 10,000.

17. The method according to claim 1, wherein the burying insulating film is provided by a CVD method.

18. The method according to claim 17, wherein the CVD method is performed by using an organic silane as a raw material, and the burying insulating film comprises at least one selected from the group consisting of $SiO_2$, SiOCH, SiCH, SiCNH and SiN.

19. The method according to claim 18, wherein the CVD method is performed by using a gas containing at least C as a raw material, and the burying layer comprises at least one selected from the group consisting of CH, CHO, CHN, CHNO, CHF and CF.

* * * * *

UNITED STATES PATENT AND TRADEMARK OFFICE
CERTIFICATE OF CORRECTION

PATENT NO. : 7,329,601 B2 Page 1 of 1
APPLICATION NO. : 11/072294
DATED : February 12, 2008
INVENTOR(S) : Miyajima It is certified that error appears in the above-identified patent and that said Letters Patent is hereby corrected as shown below:

Claim 19, column 10, line 29, change "claim 18" to --claim 17--.

Signed and Sealed this

Tenth Day of June, 2008

JON W. DUDAS
*Director of the United States Patent and Trademark Office*